(12) United States Patent
Kinsley

(10) Patent No.: US 7,172,465 B2
(45) Date of Patent: Feb. 6, 2007

(54) EDGE CONNECTOR INCLUDING INTERNAL LAYER CONTACT, PRINTED CIRCUIT BOARD AND ELECTRONIC MODULE INCORPORATING SAME

(75) Inventor: Thomas H. Kinsley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/064,344

(22) Filed: Feb. 22, 2005

(65) Prior Publication Data

US 2006/0189175 A1 Aug. 24, 2006

(51) Int. Cl.
*H01R 24/00* (2006.01)
(52) U.S. Cl. ........................ 439/637; 439/632
(58) Field of Classification Search ................ 439/637, 439/636, 632
See application file for complete search history.

(56) References Cited

U.S. PATENT DOCUMENTS

| | | | |
|---|---|---|---|
| 3,492,538 A | 1/1970 | Fergusson | |
| 4,116,516 A * | 9/1978 | Griffin | 439/67 |
| 4,331,370 A | 5/1982 | Andrews et al. | |
| 4,647,123 A | 3/1987 | Chin et al. | |
| 4,806,110 A * | 2/1989 | Lindeman | 439/108 |
| 5,024,609 A | 6/1991 | Piorunneck | |
| 5,112,238 A | 5/1992 | Cizin | |
| 5,238,412 A | 8/1993 | Morishita et al. | |
| 5,270,964 A | 12/1993 | Bechtolsheim et al. | |
| 5,283,949 A | 2/1994 | Jurisich | |
| 5,345,364 A | 9/1994 | Biernath | |
| 5,383,148 A | 1/1995 | Testa et al. | |
| 5,402,078 A | 3/1995 | Hamilton | |
| 5,419,708 A * | 5/1995 | Koss et al. | 439/59 |
| 5,463,532 A | 10/1995 | Petitpierre et al. | |
| 5,648,892 A | 7/1997 | Wieloch et al. | |
| 5,671,126 A | 9/1997 | Verding et al. | |
| 5,692,910 A | 12/1997 | Mittal | |
| 5,822,195 A | 10/1998 | Brench et al. | |
| 5,827,604 A | 10/1998 | Uno et al. | |
| 5,910,025 A | 6/1999 | Mendolia | |
| 5,971,806 A | 10/1999 | Evans et al. | |
| 6,024,587 A * | 2/2000 | Garth | 439/101 |
| 6,031,727 A | 2/2000 | Duesman et al. | |
| 6,048,213 A | 4/2000 | Lai et al. | |
| 6,095,821 A | 8/2000 | Panella et al. | |
| 6,124,778 A * | 9/2000 | Rowley et al. | 336/200 |
| 6,135,781 A | 10/2000 | Pope et al. | |
| 6,157,289 A | 12/2000 | Kojima et al. | |
| 6,309,254 B1 | 10/2001 | Korsunsky | |
| 6,329,607 B1 | 12/2001 | Fjelstad et al. | |
| 6,418,034 B1 | 7/2002 | Weber et al. | |

(Continued)

*Primary Examiner*—Hae Moon Hyeon
(74) *Attorney, Agent, or Firm*—TraskBritt

(57) ABSTRACT

An edge connector, system, printed circuit board and electronic module are described, which include an edge connector comprised of a substrate, including a first major exterior surface, a second major exterior surface, and a minor exterior surface. The edge connector further includes at least one of a first conductive contact affixed to the first major exterior surface and one of a second conductive contact affixed to the second major exterior surface. Additionally, the edge connector includes at least one third conductive contact conductively coupled to at least a portion of any internal conductive layer of the substrate and the third conductive contact is configured off-plane from the minor exterior surface.

25 Claims, 9 Drawing Sheets

U.S. PATENT DOCUMENTS

| | | |
|---|---|---|
| 6,421,250 B1 * | 7/2002 | Kim et al. .................. 361/784 |
| 6,431,876 B1 | 8/2002 | Svenkeson et al. |
| 6,464,537 B1 | 10/2002 | Letourneau et al. |
| 6,508,674 B1 | 1/2003 | Svenkeson et al. |
| 6,533,614 B1 | 3/2003 | Akama et al. |
| 6,674,644 B2 * | 1/2004 | Schulz ....................... 361/728 |
| 6,675,313 B2 | 1/2004 | Cuthbert |
| 6,699,395 B1 | 3/2004 | Svenkeson et al. |
| 6,780,064 B2 | 8/2004 | Abel et al. |
| 6,789,146 B1 | 9/2004 | Dlugosch |
| 6,926,561 B1 * | 8/2005 | Handforth et al. .......... 439/632 |
| 2002/0134584 A1 | 9/2002 | Higuchi et al. |

* cited by examiner

EDGE CONNECTOR INCLUDING INTERNAL LAYER CONTACT, PRINTED CIRCUIT BOARD AND ELECTRONIC MODULE INCORPORATING SAME

BACKGROUND OF THE INVENTION

1. Field of the Invention

The present invention relates generally to printed circuit boards, and more particularly, to connecting printed circuit boards to other assemblies through connection systems.

2. State of the Art

Electronic and computer assemblies widely use board-to-board connector assemblies for coupling one board (e.g., daughter board) to a second board (e.g., motherboard) without requiring the use of separate cabling. One form of a common board-to-board connection system includes an edge connector and a socket connector coupled in a mating arrangement. For a printed circuit board application, each of the edge and socket connectors may be configured in an elongated arrangement with each including corresponding conductive contacts therealong. To facilitate an increasing number of interconnects on the respective boards, the length of the edge and socket connectors may increase until such a configuration reaches an unacceptable dimension.

One specific application of a board-to-board connection system includes the coupling of support or daughter boards with integrated circuits thereon with a motherboard. The connection system provides the electrical interface between additional accessible resources (e.g., memory resources) and a host system. The additional resources are formed by combining a printed circuit board with integrated circuits which form an electronic module. Specific electronic modules include memory modules when the integrated circuits are memory devices. These electronic modules are generally configured with ever-increasingly sophisticated integrated circuits and devices which require still-increasing interface demands for the connection systems.

An electronic module typically includes a printed circuit board configured as a rigid substrate fabricated generally to include multiple conductive layers and having one or more integrated circuits thereon and a connection system. One typical well known board-to-board connection system includes a portion of a printed circuit board having several electrically conductive pins or contacts along one or more edges which respectively engage with a corresponding socket including corresponding contacts (e.g., metal spring contacts). The edge and socket contacts provide an electrical connection between the electronic module and a receiving motherboard.

Printed circuit boards may be utilized to form electronic modules which are commonplace within computers and other electronic systems. As stated, one form of electronic modules includes memory modules which are used to store data in portable electronic devices such as computers. Memory modules typically include at least one integrated circuit (IC) chip which may include one or more forms of memory devices. One advantage of such memory modules is their ease in insertion into and removal from the electronic device by the use of a multi-contact connection system as described above.

Memory modules have been designed to conform to specific design standards for ease in standardization between electronic device and memory module providers. One accepted standard includes a Single In-Line Memory Module (SIMM), which is a compact circuit board designed to accommodate memory chips. The SIMM was developed to provide a modular solution for the installation of memory components into a computer or other electronic system designed to receive such components. A specific SIMM, because of the standardized design, may receive all of the necessary logic signals including the requisite power and ground signals through a board-to-board connection system associated therewith.

Memory modules that include one or more memory devices may be configured in the form of (i) a SIMM, which employs a single line or row of conductive contacts on a single side of the printed circuit board of the module or may, alternatively, be configured as (ii) a Dual In-Line Memory Module (DIMM), which utilizes two lines of conductive contacts on opposing sides of the module's printed circuit board. Clearly, a DIMM can accommodate a greater number of electrical connections to an external socket than is available from a SIMM of the same relative size. As functionality and memory density increases on memory modules, the need or desire for more electrical contacts or I/O signals becomes more apparent.

FIG. 1 illustrates front and back views of a conventional DIMM 100. The DIMM 100 includes a printed circuit board 102 on which a plurality of semiconductor memory devices 104, 106 are operably coupled. Each of the sides of DIMM 100 includes a corresponding array of electric contacts 108, 110 for electrically connecting the memory devices in a receiving electronic or computer system. Each of the contacts within each of the array of electric contacts 108, 110 typically assumes a fixed pitch or spacing as defined by one or more corresponding standardization specifications. When an increased number of contacts is desired due to an increased complexity of a memory module, the contact spacing or pitch must be reduced or the printed circuit board must be enlarged to accommodate the increased number of desired conductive contacts. It should be appreciated that a physical limitation may be imposed due to manufacturing capabilities or reliability issues that may present limitations on increasing the size of a printed circuit board or reducing the pitch between contacts on the printed circuit board.

Using a conventional notebook or compact portable electronic or computer system as an example, space for electronic components may be limited. In particular, memory modules, which may already consume a significant portion of the available volume, are increasingly designed to be more complex and sophisticated. Resolving the dilemma by simply increasing the size of the available memory module is not acceptable. As memory module technologies have become more complex including, for example, an increasing number of address lines, conventional configurations, such as those supported by specific standards (e.g., DDR2 SODIMM), have become conductive contact-limited and may not support the additional interconnections required for an expanded-capability memory standard (e.g., DDR3) technologies. Additionally, memory devices supporting faster switching times may require enhanced signal conditioning techniques (e.g., improved ground return paths), which may require further improved interconnection techniques. To accommodate increased functionality, memory modules and the interconnection standards associated therewith require additional interface contacts and techniques if the overall dimensions of the memory modules are not to be significantly increased.

FIG. 2 is a cross-sectional area of an exemplary memory module configured as a DDR2 module as fitted into a receiving socket on a motherboard, in accordance with the prior art. A cross-sectional view of DIMM 100 illustrates a cross-sectional view of a printed circuit board 102 which is illustrated to include a plurality of conductive layers 112–122 separated by insulative or nonconductive layers 124–132. As illustrated, the exterior conductive layers 112, 122 respectively couple to conductive contacts 134, 136. Accordingly, the DIMM 100 is received in a socket 138 which includes socket contacts 140, 142 for providing an electrical connection between conductive contacts 134, 136 and a motherboard 144.

In one arrangement, printed circuit board 102 includes various conductive layers that may have primary configurations as power and ground layers, illustrated as enhanced-thickness conductive layers 114, 120. Additionally, printed circuit board 102 may include one or more signal layers illustrated as conductive layers 112, 116, 118, 122. As further illustrated, only the exterior conductive layers 112, 122 are available for exterior coupling with the conductive contacts 134, 136. Therefore, coupling of internal conductive layers to conductive contacts is performed through the use of vias (not shown) for coupling internal conductive layers to the accessible exterior surfaces. The fabrication of a multilayer substrate is well known and not described herein. Therefore, there is a desire to utilize a similar board design and volume while providing additional available conductive contacts for the coupling of additional signals to a receiving socket.

BRIEF SUMMARY OF THE INVENTION

An edge connector, system, printed circuit board and electronic module is provided. In one embodiment of the present invention, an edge connector comprises a substrate, including a first major exterior surface, a second major exterior surface, and a minor exterior surface. The edge connector further includes at least one of a first conductive contact affixed to the first major exterior surface, which is conductively coupled to one of the conductive layers, and one of a second conductive contact affixed to the second major exterior surface, which is also conductively coupled to one of the conductive layers. Additionally, the edge connector includes at least one third conductive contact conductively coupled to at least a portion of an internal conductive layer of the substrate. The third conductive contact is configured off-plane from the minor exterior surface.

In another embodiment of the present invention, a printed circuit board is provided. The printed circuit board includes a substrate with a first major exterior surface, a second major exterior surface, and a minor exterior surface. Formed on the substrate is a plurality of integrated circuit contacts for electrically interfacing with at least one integrated circuit. The printed circuit board further includes an edge connector formed on one edge of the substrate. The edge connector includes at least one third conductive contact conductively coupled to at least a portion of a first internal conductive layer of the substrate and the third conductive contact is configured off-plane from the minor exterior surface.

In a further embodiment of the present invention, an electronic module is provided, which includes a printed circuit board and at least one integrated circuit. The printed circuit board includes a substrate with a first major exterior surface, a second major exterior surface and a minor exterior surface. Formed on the substrate is a plurality of integrated circuit contacts for electrically interfacing with at least one integrated circuit. The printed circuit board further includes an edge connector formed on one edge of the substrate. The edge connector includes at least one third conductive contact conductively coupled to at least a portion of an internal conductive layer of the substrate and the third conductive contact is configured off-plane from the minor exterior surface. The integrated circuit is attached to the substrate and electrically coupled to one of the at least one of the first, second and/or third conductive contacts.

In yet another embodiment of the present invention, an electronic system is provided. The electronic system includes a processor, at least one of an input device, output device, storage device, and electronic module operationally coupled to the processor. At least one of the input device, output device, storage device, and electronic module includes an edge connector formed on one end of a substrate. The substrate includes a first major exterior surface, a second major exterior surface and a minor exterior surface. Additionally, the edge connector includes at least one of a first conductive contact affixed to the first major exterior surface which is conductively coupled to one of the conductive layers and one of a second conductive contact affixed to the second major exterior surface, which is also conductively coupled to one of the conductive layers. Additionally, the edge connector includes at least one third conductive contact conductively coupled to at least a portion of an internal conductive layer of the substrate and the third conductive contact is configured off-plane from the minor exterior surface.

BRIEF DESCRIPTION OF THE SEVERAL
VIEWS OF THE DRAWINGS

In the drawings, which illustrate what is currently considered to be the best mode for carrying out the invention:

DETAILED DESCRIPTION OF THE INVENTION

The following description of the various embodiments include specific examples drawn to electronic and memory modules, and more specifically to an improvement to an existing DIMM 200-pin edge connector and socket, however, the invention is not so limited. The presently disclosed edge connector and corresponding printed circuit boards, modules and systems find application to edge connector systems generally. Furthermore, the various embodiments of the present invention find further application for extending the available number of conductive contacts in an existing design without incurring a significant increase in the amount of required space.

Figure 1:
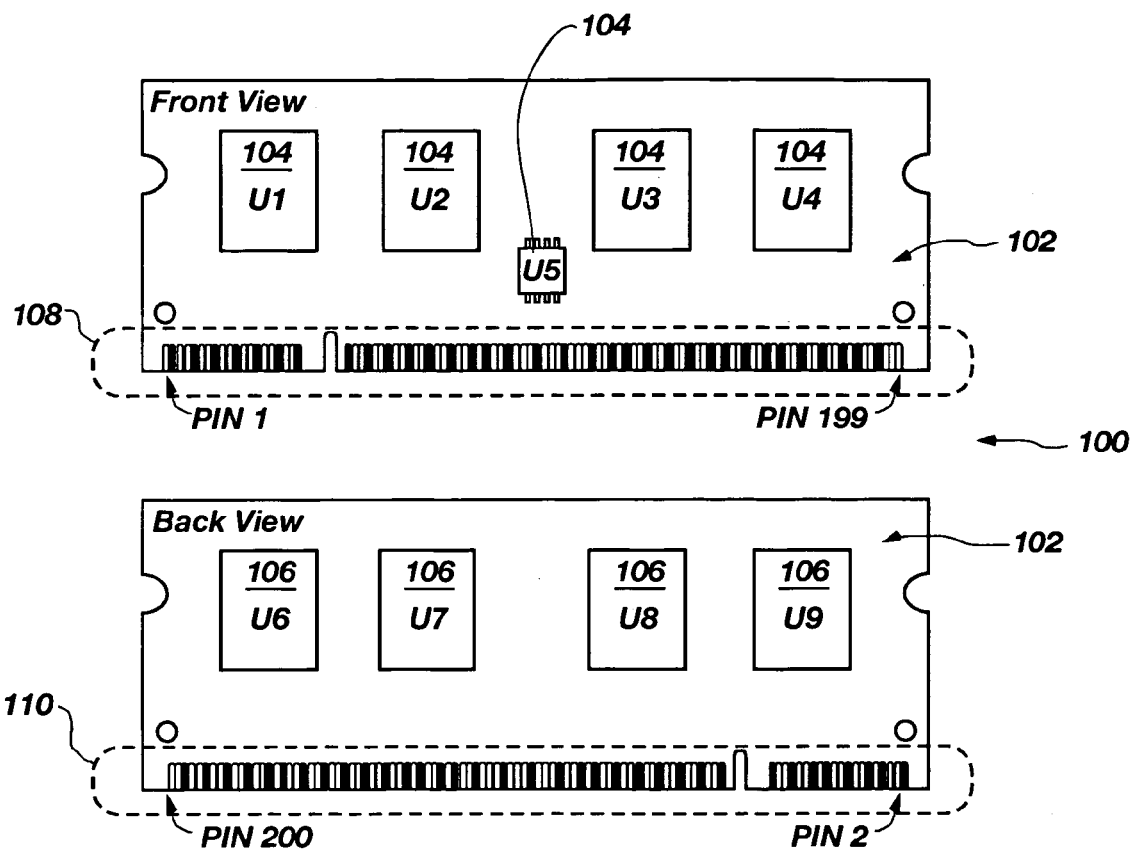
FIG. 1 is a plan view of an electronic module including an array of contacts, in accordance with the prior art.
Figure 2:
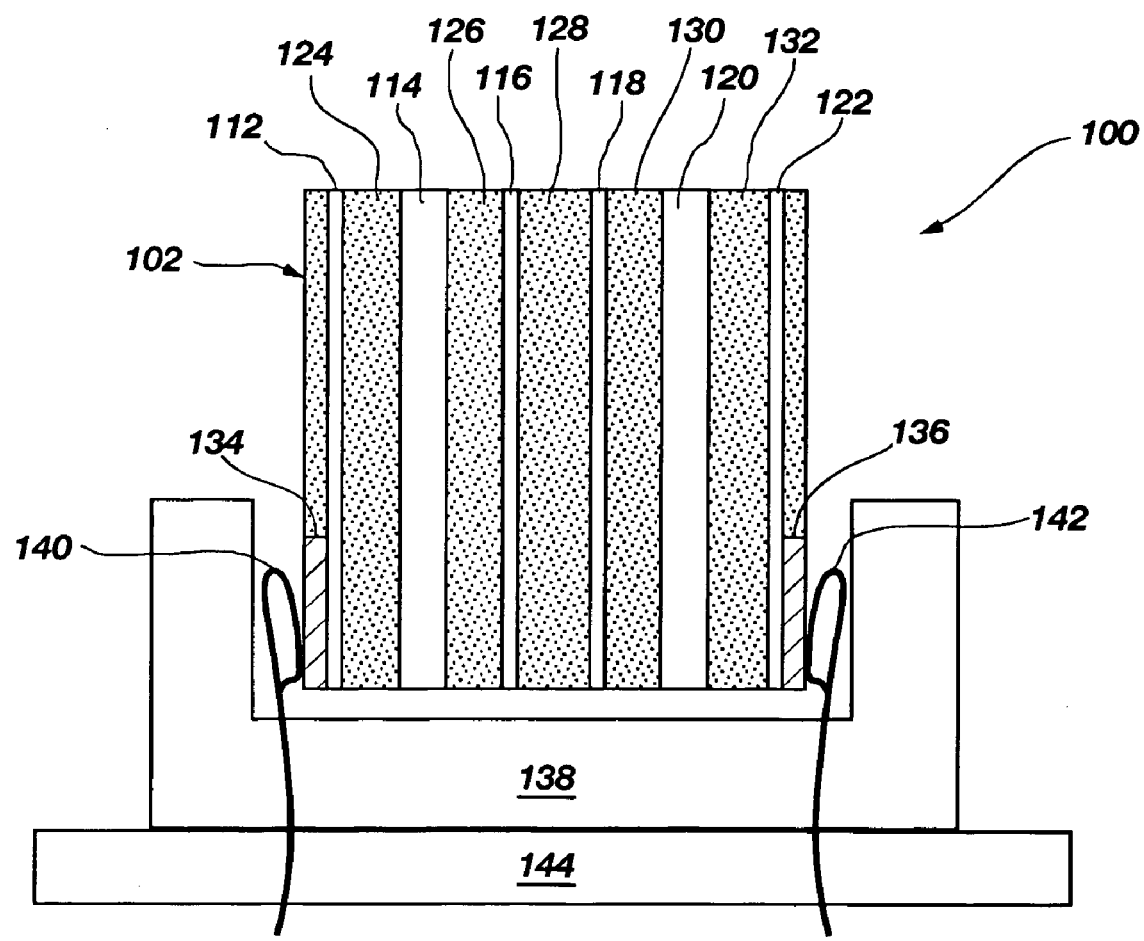
FIG. 2 is a partial cross-sectional diagram of a connection system including a printed circuit board interfaced with a corresponding socket, in accordance with the prior art.
Figure 3:
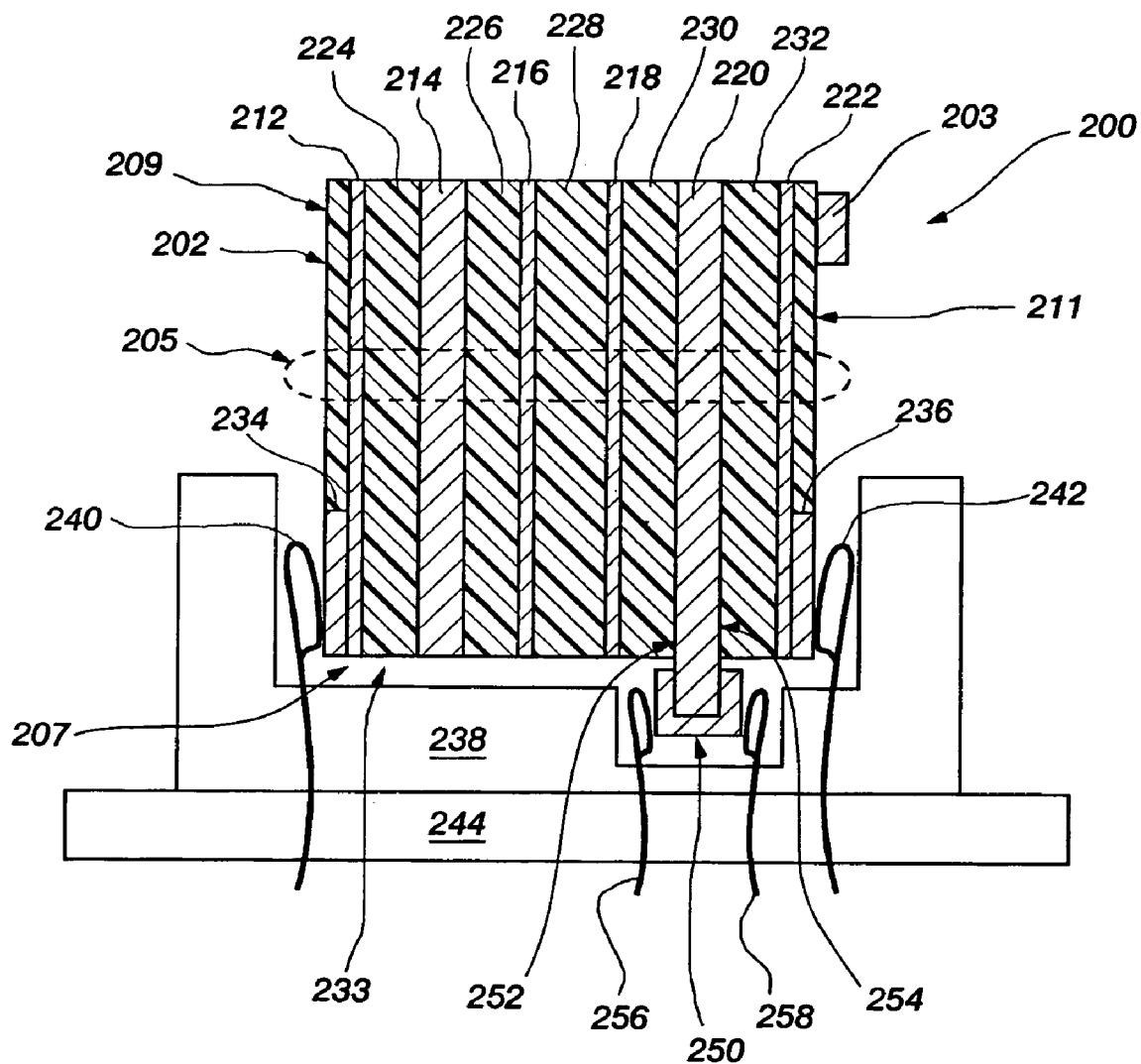
FIG. 3 is a partial cross-sectional diagram of a connection system, in accordance with an embodiment of the present invention.

FIG. 3 is a partial cross-sectional view of a connection system including a card edge connector, in accordance with one or more embodiments of the present invention. In FIG. 3, a connection system 200 is used to couple a printed circuit board 202 with another assembly such as a motherboard 244. Printed circuit board 202 may be configured as an electronic module or memory module when integrated circuits are attached thereto via one or more integrated circuit pads 203. Connection system 200 further includes a socket 238 conductively coupled to motherboard 244 for receiving therein and electrically coupling therewith printed circuit board 202.

Printed circuit board 202 includes a substrate 205, which may include a plurality of conductive layers 212–222 separated and insulated by nonconductive layers 224–232. The fabrication and formation of substrate 205 and the corresponding conductive and nonconductive layers is known in the art and is not further described herein. Additionally, the respective thicknesses of each of the conductive and nonconductive layers may vary depending upon the desired application and associated specifications relating to such electrical characteristics as impedance, capacitance, cross-talk and other isolation and signal conditioning techniques known by those of ordinary skill in the art.

In accordance with the present embodiment, an edge connector 207 includes the substrate 205 which is fabricated to include generally a first major exterior surface 209 and a second major exterior surface 211. The major exterior surfaces 209, 211 include the generally planar exterior surfaces which may be configured as conductive surfaces for routing interconnection signals thereon and may be further insulated or passivated for electrical integrity and mechanical reliability concerns.

Electrical connectivity with printed circuit board 202 is facilitated through conductive contacts on one or more major exterior surfaces 209, 211. As illustrated in FIG. 3, the one or more conductive contacts may include a first conductive contact 234 conductively affixed to a first major conductive layer 212 of substrate 205 and a second conductive contact 236 affixed to a second major conductive layer 222 of substrate 205. In the present cross-sectional view, only one conductive contact is illustrated on each of the major exterior surfaces, however, the present invention contemplates at least one and generally a plurality of conductive contacts longitudinally distributed according to a desirable spacing or pitch along one or more major exterior surfaces 209, 211. Electrical coupling from the conductive contacts 234, 236 to the motherboard 244 is facilitated through one or more contacts 240, 242 as positioned and retained by a housing portion of socket 238.

The substrate 205 further includes a minor exterior surface 233, which is generally orthogonal to the major exterior surfaces 209, 211. The edge connector 207, in addition to conductive contacts 234, 236 located on major exterior surfaces 209, 211, further includes at least one conductive contact formed on the minor exterior surface 233. By way of illustration, a third conductive contact 250 provides an electrical interface to one or more conductive layers 214–220 of substrate 205. A third conductive contact is formed off-plane from the general plane associated with minor exterior surface 233. In the present embodiment, the third conductive contact 250 is illustrated as protruding or extending off-plane from the minor exterior surface 233. Electrical coupling to the third conductive contact 250 is provided by one or more contacts 256, 258 as retained in the housing of socket 238 and as electrically coupled with motherboard 244. The third conductive contact 250 is formed on an extension, for example, of an internal conductive layer 220 by forming the third conductive contact 250 about one or more surfaces 252, 254.

Figure 4:
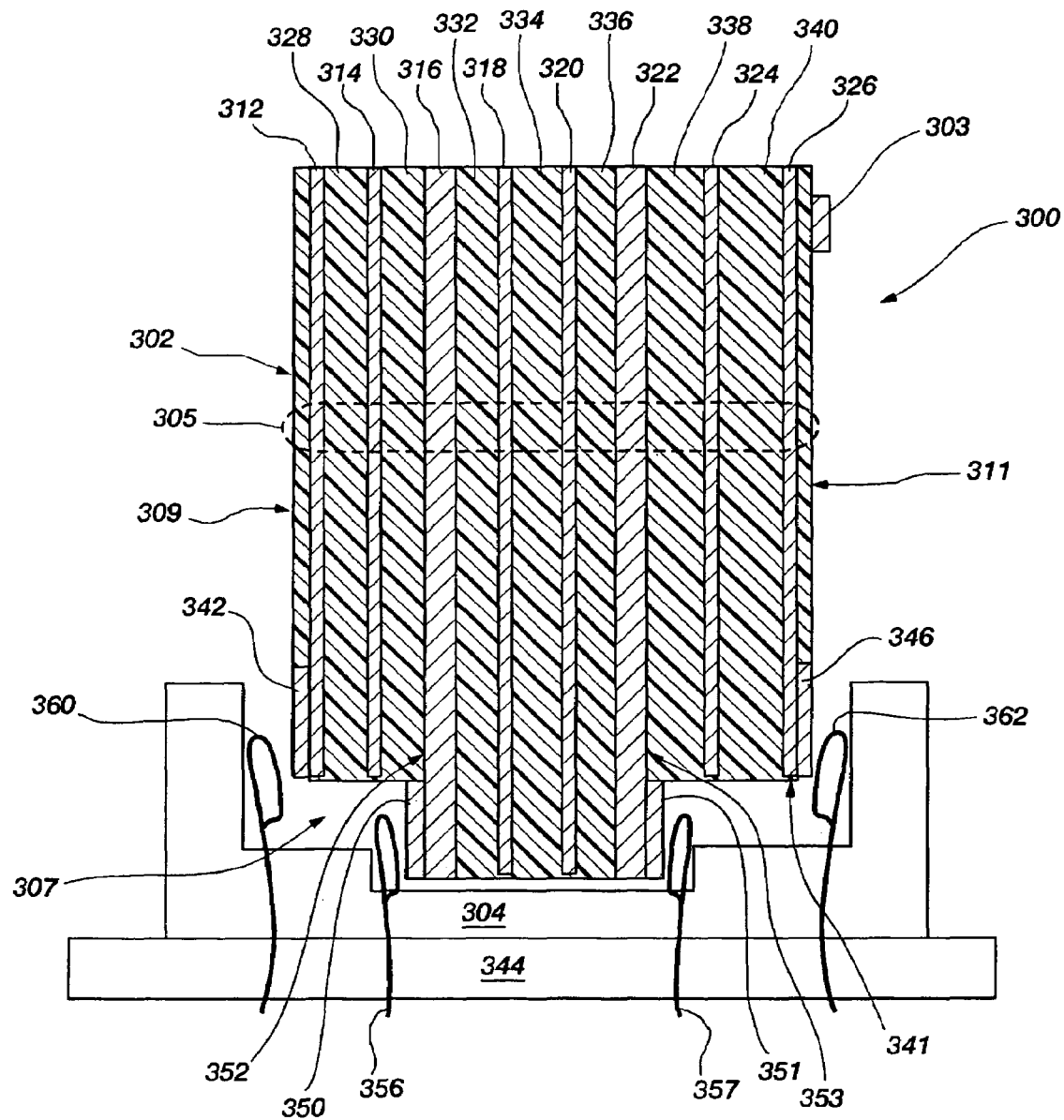
FIG. 4 is a partial cross-sectional diagram of a connection system, in accordance with another embodiment of the present invention.

FIG. 4 is a partial cross-sectional view of a connection system including a card edge connector, in accordance with another embodiment of the present invention. In FIG. 4, a connection system 300 is used to couple a printed circuit board 302 with another assembly such as a motherboard 344. Printed circuit board 302 may be configured as an electronic module or memory module when integrated circuits and devices are attached thereto via one or more integrated circuit pads 303. Connection system 300 further includes a socket 304 conductively coupled to motherboard 344 for receiving therein and electrically coupling therewith printed circuit board 302.

Printed circuit board 302 includes a substrate 305, which may include a plurality of conductive layers 312–326 separated and insulated by interposed nonconductive layers 328–340. The fabrication and formation of substrate 305 and the corresponding conductive and nonconductive layers is known in the art and is not further described herein. Additionally, the respective thicknesses of each of the conductive and nonconductive layers may vary depending upon the desired application and associated specifications relating to such electrical characteristics as impedance, capacitance, cross-talk and other isolation and signal conditioning techniques known by those of ordinary skill in the art.

In accordance with the present embodiment, an edge connector 307 includes the substrate 305, which is fabricated to include generally a first major exterior surface 309 and a second major exterior surface 311. The major exterior surfaces 309, 311 include the generally planar exterior surfaces which may be configured as conductive surfaces for routing interconnection signals thereon and may be further insulated or passivated for electrical integrity and mechanical reliability concerns.

Electrical connectivity with printed circuit board 302 is facilitated through conductive contacts on one or more major exterior surfaces 309, 311. As illustrated in FIG. 4, the one or more conductive contacts may include a first conductive contact 342 affixed to a first major conductive layer 312 of substrate 305 and a second conductive contact 346 affixed to a second major conductive layer 326 of substrate 305. In the present cross-sectional view, only one conductive contact is illustrated on each of the major exterior surfaces, however, the present invention contemplates at least one and generally a plurality of conductive contacts are distributed according to a desirable spacing or pitch along one or more major exterior surfaces 309, 311. Electrical coupling from the conductive contacts 342, 346 to the motherboard 344 is facilitated through one or more contacts 360, 362 as positioned and retained by a housing portion of socket 304.

The substrate 305 further includes a minor exterior surface 341, which is generally orthogonal to the major exterior surfaces 309, 311. The edge connector 307, in addition to conductive contacts 342, 346 located on major exterior surfaces 309, 311, further includes at least one conductive contact formed on the minor exterior surface 341. By way of illustration, a third conductive contact 350 provides an electrical interface to an exemplary conductive layer 316 of substrate 305. The third conductive contact is formed off-plane from the general plane associated with minor exterior surface 352. In the present embodiment, the third conductive contact 350 is illustrated as protruding or extending off-plane from the minor exterior surface 352. Electrical coupling to the third conductive contact 350 is provided by a contact 356 as retained in the housing of socket 304 and as electrically coupled with motherboard 344. The third conductive contact 350 is formed on an extension, for example, of one or more internal conductive layers and one or more nonconductive layers by forming the third conductive contact 350 about a surface 352.

In yet another embodiment, the edge connector 307 may further include an additional conductive contact formed on the minor exterior surface 341. By way of illustration, a fourth conductive contact 351 provides an electrical interface to an exemplary internal conductive layer 322 of substrate 305. The fourth conductive contact is formed off-plane from the general plane associated with minor exterior surface 341. In the present embodiment, the fourth conductive contact 351 is illustrated as protruding or extending off-plane from the minor exterior surface 341. Electrical coupling to the fourth conductive contact 351 is provided by a contact 357 as retained in the housing of socket 304 and as electrically coupled with motherboard 344. The fourth conductive contact 351 is formed on an extension, for example, of one or more conductive layers and one or more nonconductive layers by forming the fourth conductive contact 351 about a surface 353.

Figure 5:
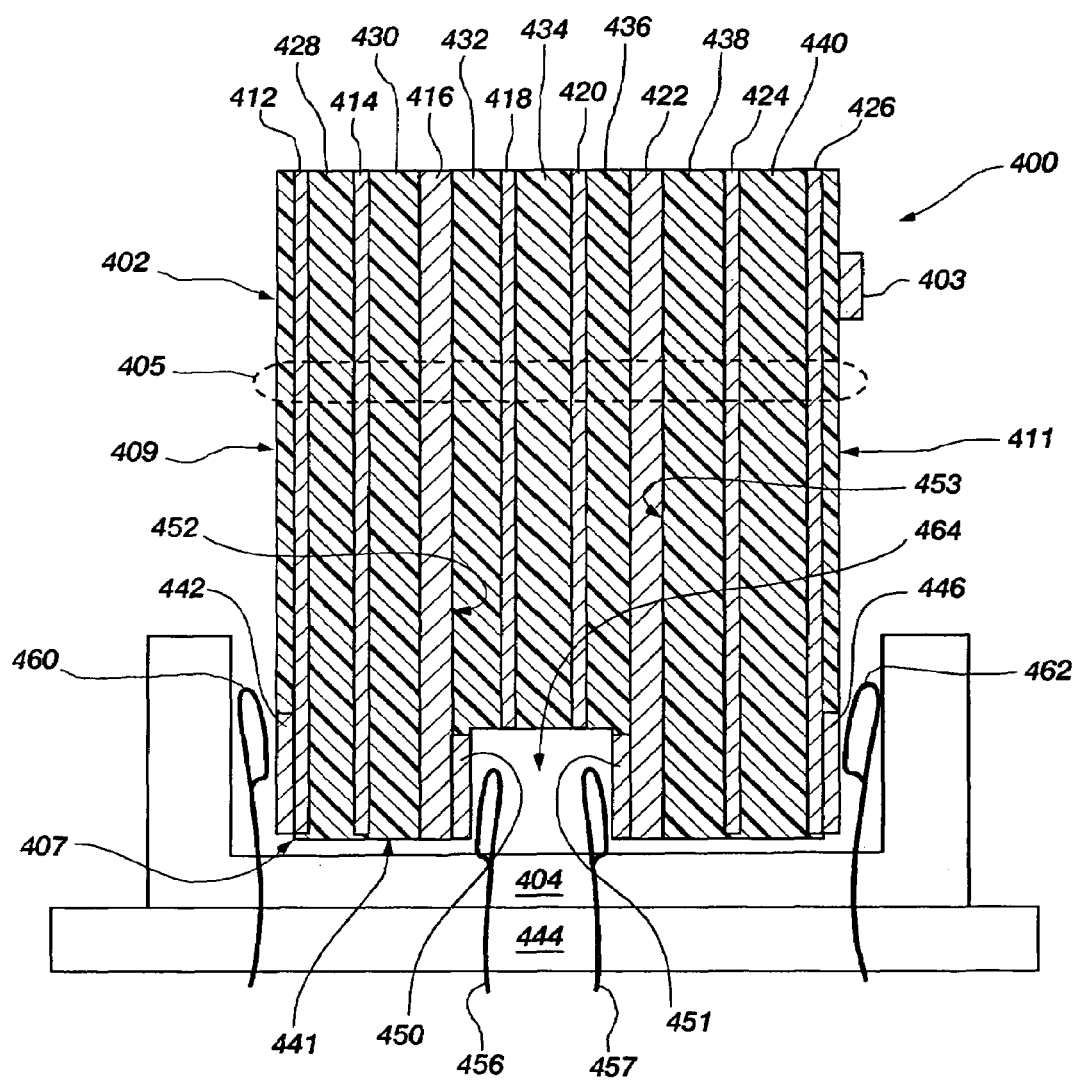
FIG. 5 is a partial cross-sectional diagram of a connection system, in accordance with a further embodiment of the present invention.

FIG. 5 is a partial cross-sectional view of a connection system including a card edge connector, in accordance with yet another embodiment of the present invention. In FIG. 5, a connection system 400 is used to couple a printed circuit board 402 with another assembly such as a motherboard 444. Printed circuit board 402 may be configured as an electronic module or memory module when integrated circuits and devices are attached thereto via one or more integrated circuit pads 403. Connection system 400 further includes a socket 404 conductively coupled to motherboard 444 for receiving therein and electrically coupling therewith printed circuit board 402.

Printed circuit board 402 includes a substrate 405, which may include a plurality of conductive layers 412–426 separated and insulated by interposed nonconductive layers 428–440. The fabrication and formation of substrate 405 and the corresponding conductive and nonconductive layers is known in the art and is not further described herein. Additionally, the respective thicknesses of each of the conductive and nonconductive layers may vary depending upon the desired application and associated specifications relating to such electrical characteristics as impedance, capacitance, cross-talk and other isolation and signal conditioning techniques known by those of ordinary skill in the art.

In accordance with the present embodiment, an edge connector 407 includes the substrate 405, which is fabricated to include generally a first major exterior surface 409 and a second major exterior surface 411. The major exterior surfaces 409, 411 include the generally planar exterior surfaces which may be configured as conductive surfaces for routing interconnection signals thereon and may be further insulated or passivated for electrical integrity and mechanical reliability concerns.

Electrical connectivity with printed circuit board 402 is facilitated through conductive contacts on one or more major exterior surfaces 409, 411. As illustrated in FIG. 5, the one or more conductive contacts may include a first conductive contact 442 affixed to a first major conductive layer 412 of substrate 405 and a second conductive contact 446 affixed to a second major conductive layer 426 of substrate 405. In the present cross-sectional view, only one conductive contact is illustrated on each of the major exterior surfaces, however, the present invention contemplates at least one and generally, a plurality of conductive contacts, longitudinally distributed according to a desirable spacing or pitch along one or more major exterior surfaces 409, 411. Electrical coupling from the conductive contacts 442, 446 to the motherboard 444 is facilitated through one or more contacts 460, 462 as positioned and retained by a housing portion of socket 404.

The substrate 405 further includes a minor exterior surface 441, which is generally orthogonal to the major exterior surfaces 409, 411. The edge connector 407, in addition to conductive contacts 442, 446 located on major exterior surfaces 409, 411, further includes at least one conductive contact formed on the minor exterior surface 441. By way of illustration, a third conductive contact 450 provides an electrical interface to an exemplary conductive layer 416 of substrate 405. The third conductive contact is formed off-plane from the general plane associated with minor exterior surface 441. In the present embodiment, the third conductive contact 450 is illustrated as being formed in an indentation or channel extending inward and off-plane from the minor exterior surface 441. Electrical coupling to the third conductive contact 450 is provided by a contact 456 as retained in the housing of socket 404 and as electrically coupled with motherboard 444. The third conductive contact 450 is formed in a channel 464, for example, of one or more internal conductive layers and one or more nonconductive layers by forming the third conductive contact 450 about a surface 452.

In yet another embodiment, the edge connector 407 may further include an additional conductive contact formed on the minor exterior surface 441. By way of illustration, a fourth conductive contact 451 provides an electrical interface to an exemplary conductive layer 422 of substrate 405. The fourth conductive contact is formed off-plane from the general plane associated with minor exterior surface 441. In the present embodiment, the fourth conductive contact 451 is illustrated as being formed in an indentation or channel extending inward and off-plane from the minor exterior surface 441. Electrical coupling to the fourth conductive contact 451 is provided by a contact 457 as retained in the housing of socket 404 and as electrically coupled with motherboard 444. The fourth conductive contact 451 is formed in a channel 464, for example, of one or more conductive layers and one or more nonconductive layers by forming the fourth conductive contact 451 about a surface 453.

Figure 6:
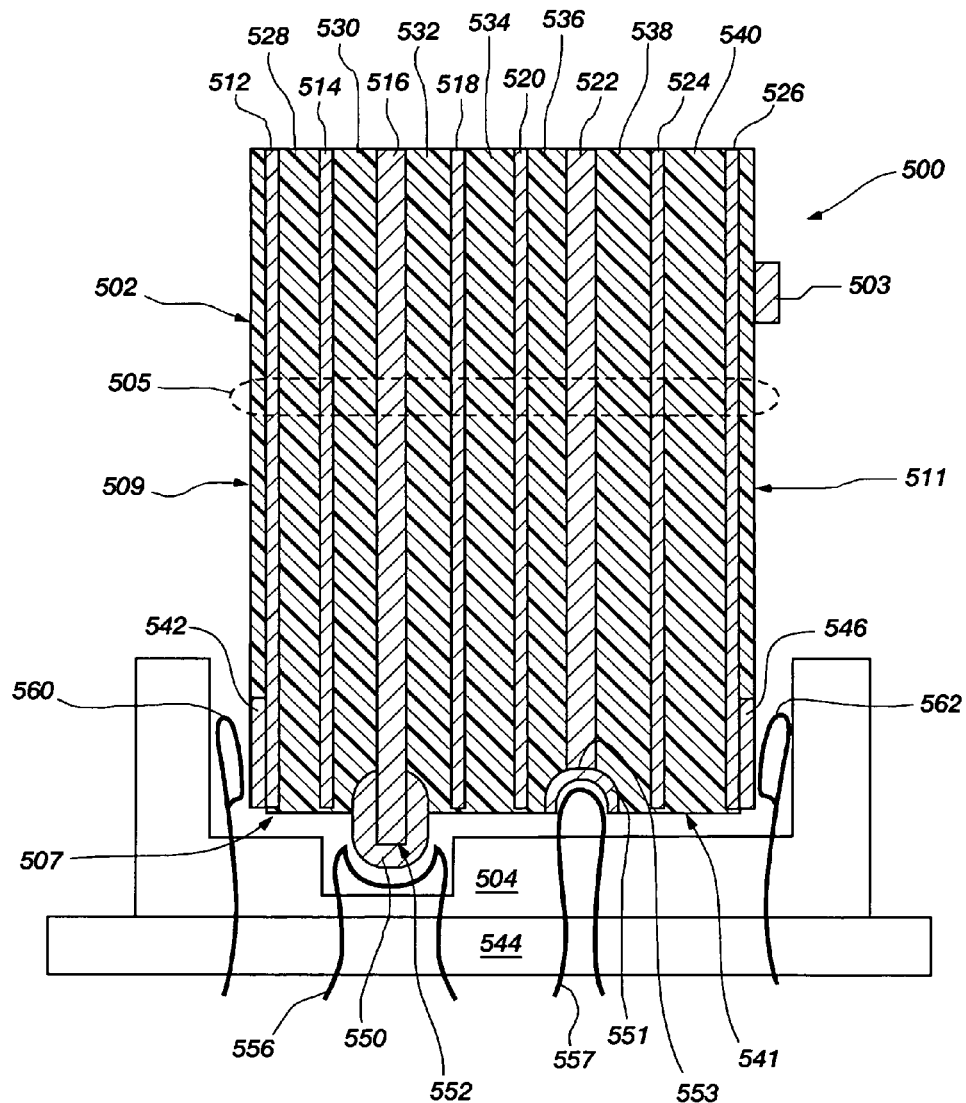
FIG. 6 is a partial cross-sectional diagram of a connection system, in accordance with a yet further embodiment of the present invention.

FIG. 6 is a partial cross-sectional view of a connection system including a card edge connector, in accordance with yet another embodiment of the present invention. In FIG. 6, a connection system 500 is used to couple a printed circuit board 502 with another assembly such as a motherboard 544. Printed circuit board 502 may be configured as an electronic module or memory module when integrated circuits and devices are attached thereto via one or more integrated circuit pads 503. Connection system 500 further includes a socket 504 conductively coupled to motherboard 544 for receiving therein and electrically coupling therewith printed circuit board 502.

Printed circuit board 502 includes a substrate 505, which may include a plurality of conductive layers 512–526 separated and insulated by interposed nonconductive layers 528–540. The fabrication and formation of substrate 505 and the corresponding conductive and nonconductive layers is known in the art and is not further described herein. Additionally, the respective thicknesses of each of the conductive and nonconductive layers may vary depending upon the desired application and associated specifications relating to such electrical characteristics as impedance, capacitance, cross-talk and other isolation and signal conditioning techniques known by those of ordinary skill in the art.

In accordance with the present embodiment, an edge connector 507 includes the substrate 505 which is fabricated to include generally a first major exterior surface 509 and a second major exterior surface 511. The major exterior surfaces 509, 511 include the generally planar exterior surfaces, which may be configured as conductive surfaces for routing interconnection signals thereon and may be further insulated or passivated for electrical integrity and mechanical reliability concerns.

Electrical connectivity with printed circuit board 502 is facilitated through conductive contacts on one or more major exterior surfaces 509, 511. As illustrated in FIG. 6, the one or more conductive contacts may include a first conductive contact 542 affixed to a first major conductive layer 512 of substrate 505 and a second conductive contact 546 affixed to a second major conductive layer 526 of substrate 505. In the present cross-sectional view, only one conductive contact is illustrated on each of the major exterior surfaces, however, the present invention contemplates at least one and generally, a plurality of conductive contacts, longitudinally distributed according to a desirable spacing or pitch along one or more major exterior surfaces 509, 511. Electrical coupling from the conductive contacts 542, 546 to the motherboard 544 is facilitated through one or more contacts 560, 562 as positioned and retained by a housing portion of socket 504.

The substrate 505 further includes a minor exterior surface 541, which is generally orthogonal to the major exterior surfaces 509, 511. The edge connector 507, in addition to conductive contacts 542, 546 located on major exterior surfaces 509, 511, further includes at least one conductive contact formed on the minor exterior surface 541. By way of illustration, a third conductive contact 550 provides an electrical interface to an exemplary conductive layer 516 of substrate 505. The third conductive contact is formed off-plane from the general plane associated with minor exterior surface 541. In the present embodiment, the third conductive contact 550 is illustrated as protruding or extending off-plane from the minor exterior surface 541. Electrical coupling to the third conductive contact 550 is provided by a contact 556 as retained in the housing of socket 504 and as electrically coupled with motherboard 544. The third conductive contact 550 is formed on an extension, for example, of one or more internal conductive layers by forming the third conductive contact 550 about a surface 552.

In yet another embodiment also illustrated with reference to FIG. 6, the edge connector 507 may include an alternative form of a conductive contact formed on the minor exterior surface 541. By way of illustration, a fourth conductive contact 551 provides an electrical interface to an exemplary conductive layer 522 of substrate 505. The fourth conductive contact is formed off-plane from the general plane associated with minor exterior surface 541. In the present embodiment, the fourth conductive contact 551 is illustrated as being formed in an indentation or channel extending inward and off-plane from the minor exterior surface 541. Electrical coupling to the fourth conductive contact 551 is provided by a contact 557 as retained in the housing of socket 504 and as electrically coupled with motherboard 544. The fourth conductive contact 551 is formed in a channel, for example, of one or more conductive layers and/or one or more nonconductive layers by forming the fourth conductive contact 551 about a surface 553.

While separate embodiments of conductive contacts in the various Figures have been illustrated, one or several types of conductive contacts may be incorporated on a printed circuit board and in various numbers and combinations. Additionally, while specific exemplary numbers of conductive and nonconductive layers have been illustrated, such specifics are not to be considered limiting.

Figure 7:
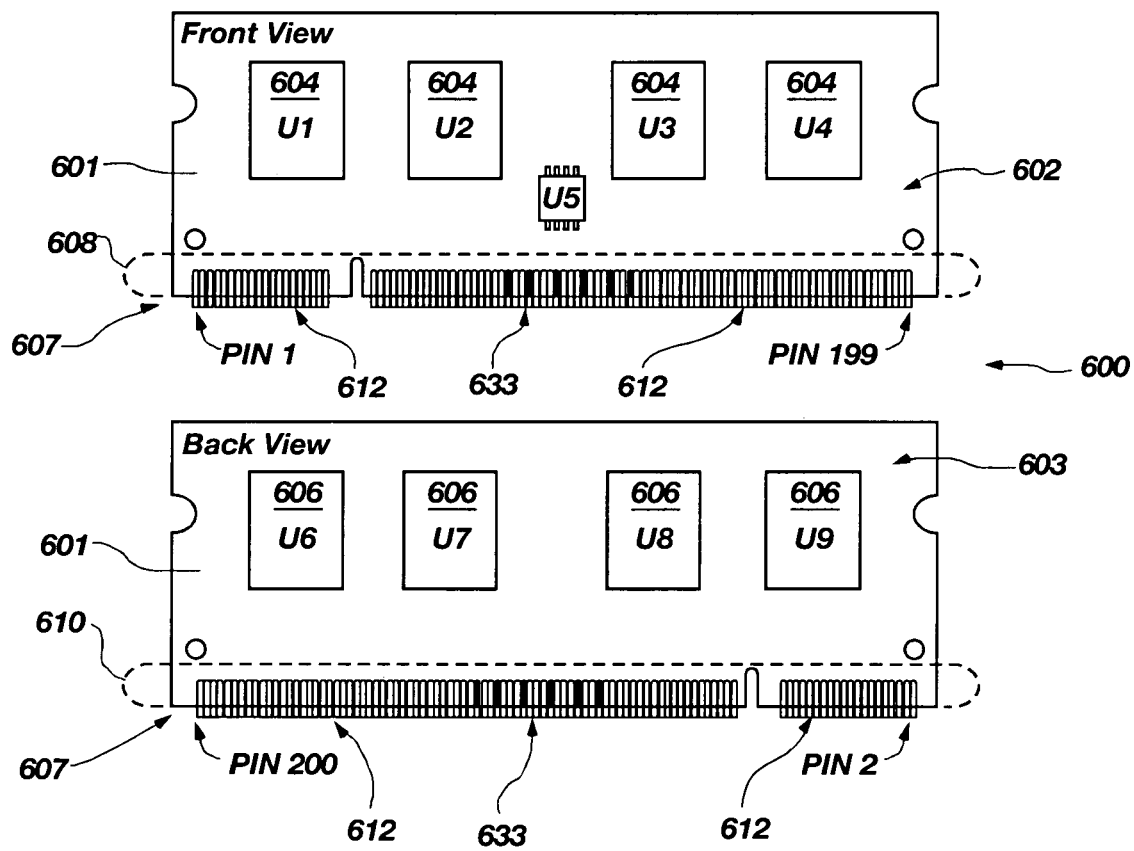
FIG. 7 is a plan view of both sides of an electronic module including an edge connector, in accordance with an embodiment of the present invention.

FIG. 7 is a plan view of an electronic module including an edge connector, in accordance with one or more embodiments of the present invention. An electronic module 600, an example of which is a memory module, includes a printed circuit board 601 and is illustrated as including a front view of a first major exterior surface 602 illustrated in the up position with the back view illustrating the second major exterior surface 603 in the up position as illustrated in the lower portion of FIG. 7. The electronic module 600 further includes one or more IC devices 604, which may be populated on a first major exterior surface 602 and/or one or more IC devices 606, which may be populated on a second major exterior surface 603.

The electronic module 600 further includes an edge connector 607 for providing electrical coupling of the IC devices 604, 606 with a next-higher assembly or system as illustrated with respect to FIG. 7. The edge connector 607 may be configured according to one or more of the cross-sectional configurations as illustrated with respect to FIGS. 3–6. The edge connector 607 includes first and second conductive contacts 608, 610 formed respectively on first major exterior surface 602 and second major exterior surface 603. While the present illustration in FIG. 7 is drawn to a specific form or standard array of first and second conductive contacts, the depiction is illustrative and various other quantities, pitches and orientations are also contemplated within the scope of the present invention.

The edge connector 607 further includes a minor exterior surface conductive contact formed about a minor exterior surface 633. As previously described with reference to the cross-sectional FIGS. 3–6, the conductive contact about minor exterior surface 633 is formed off-plane from the minor exterior surface 633 in either a protruding/extending configuration or in a channeled/indented configuration. Additionally, the minor exterior surface conductive contact may be configured as one or more third conductive contacts and/or one or more fourth conductive contacts. Therefore, for simplicity in notation, the one or more third and one or more fourth conductive contacts will be described with reference to FIGS. 7 and 8 as "minor exterior surface conductive contacts." With respect to FIG. 7, one or more minor exterior surface conductive contacts 612 are illustrated as protruding or extending from the minor exterior surface 633, but such a depiction is not to be considered as limiting.

While the one or more minor exterior surface conductive contacts 612 may assume various cross-sectional configurations as described with reference to FIGS. 3–6, the one or more minor exterior surface conductive contacts may also assume various longitudinal configurations. With respect to FIG. 7, the one or more minor exterior surface conductive contacts are illustrated as individual or discrete conductive contacts that may or may not mirror the pitch, spacing, and quantity of the first and second conductive contacts 608, 610.

Figure 8:
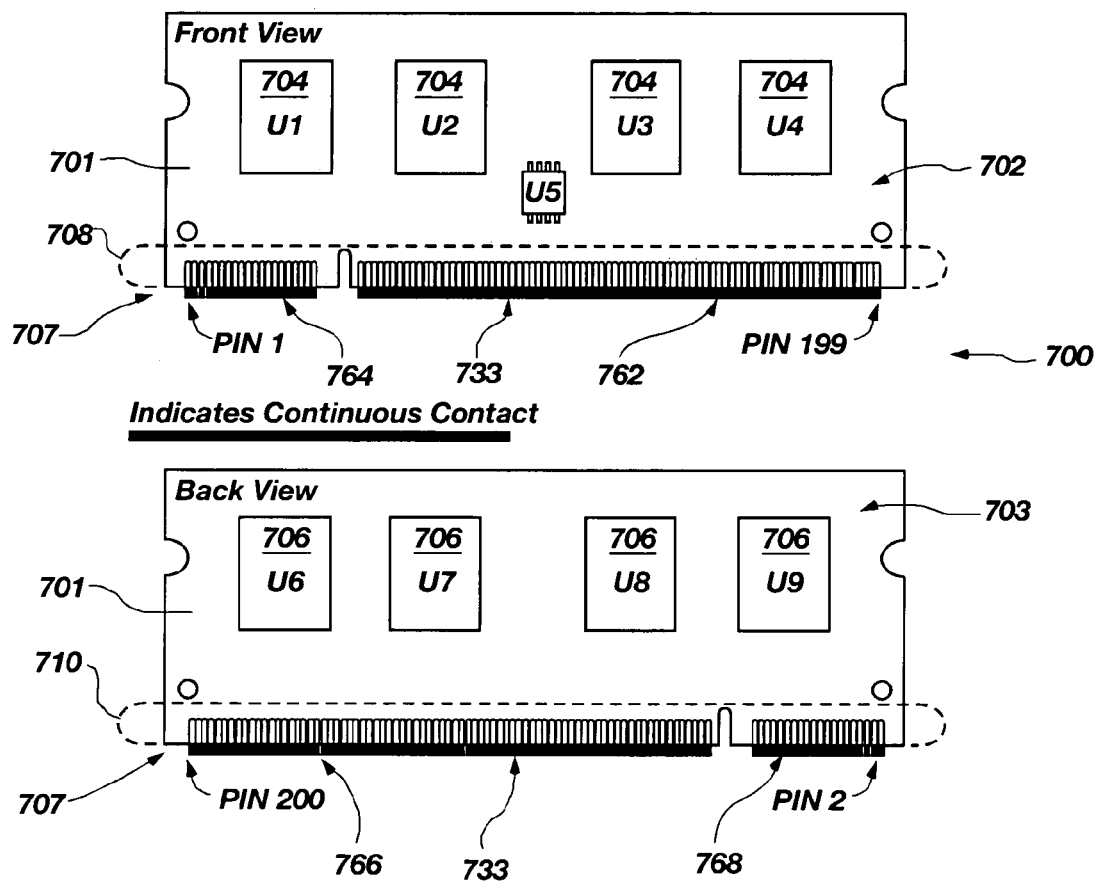
FIG. 8 is a plan view of both sides of an electronic module including an edge connector, in accordance with another embodiment of the present invention.

FIG. 8 is a plan view of an electronic module including an edge connector, in accordance with another embodiment of the present invention. An electronic module 700 includes a printed circuit board 701 with major exterior surfaces 702, 703, one or more IC devices 704, 706, and an edge connector 707 configured according to one or more of the cross-sectional configurations as illustrated with respect to FIGS. 3–6. The edge connector 707 includes first and second conductive contacts 708, 710 and a minor exterior surface conductive contact formed about a minor exterior surface 733. As stated, the one or more minor exterior surface conductive contacts may assume various cross-sectional configurations as described with reference to FIGS. 3–6. Additionally, the one or more minor exterior surface conductive contacts may also assume various longitudinal configurations.

With respect to FIG. 8, the one or more minor exterior surface conductive contacts are illustrated as a continuous conductive contact 762–768, which may be configured to electrically connect to one or more signals. By way of example, and not limitation, FIG. 8 depicts the minor exterior surface conductive contact as being separated into a plurality of segments, namely 762, 764, 766 and 768. Each of these segments may conductively connect to a corresponding plurality of signals. One specific example of signal partitioning may include minor exterior surface conductive contact 762 and 766 being configured for coupling to a conductive layer defined as a signal ground reference and minor exterior surface conductive contacts 764 and 768 being configured for coupling to a conductive layer defined as a power reference. The various embodiments of the present invention find application to an electronic module, wherein a significant number of conductive contacts are individually dedicated to providing power and ground references. According to an application of the various embodiments of the present invention, an appreciable quantity of conductive contacts may otherwise be reconfigured as signal I/O conductive contacts when a minor exterior surface conductive contact is incorporated.

Figure 9:
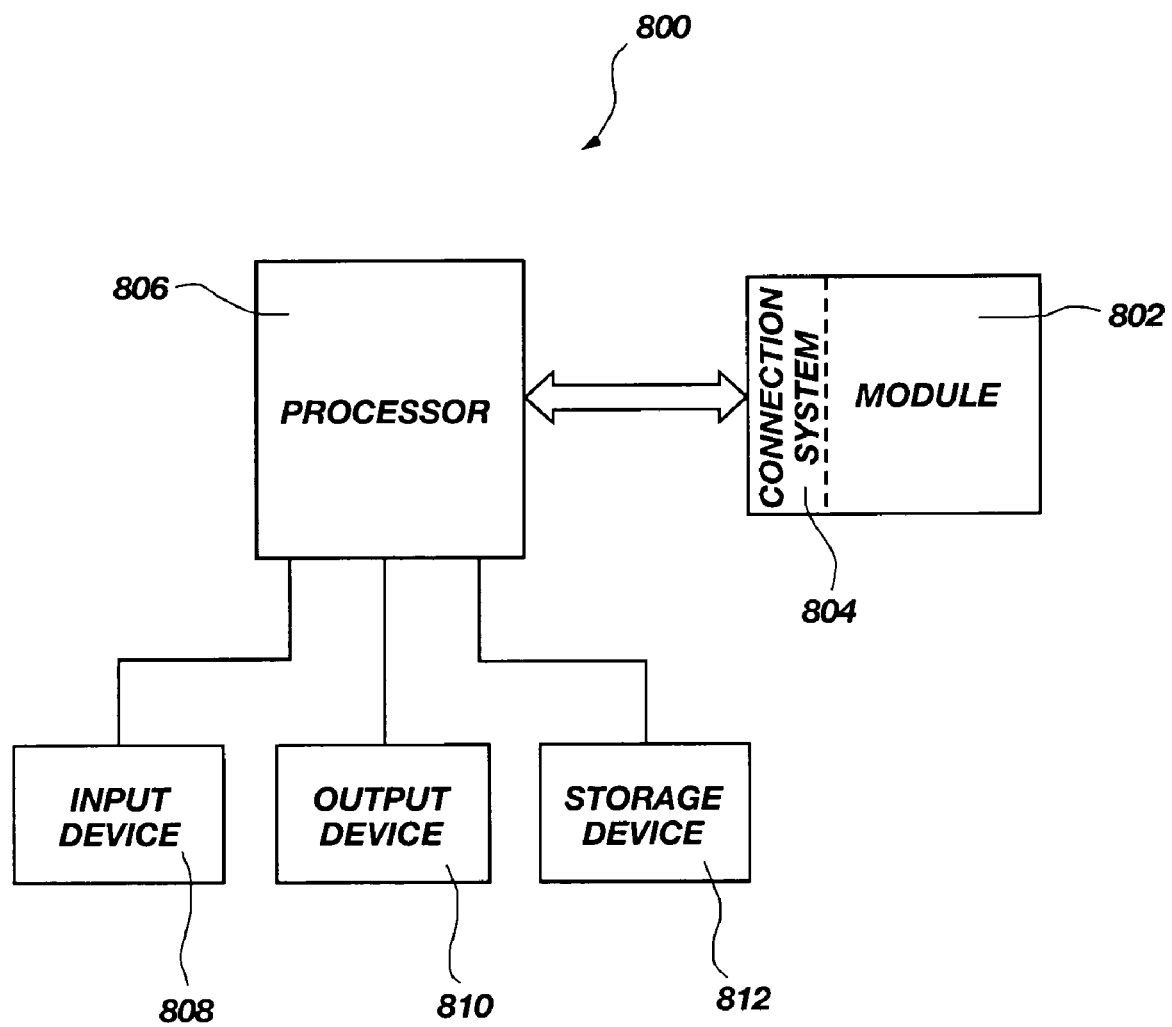
FIG. 9 is a block diagram of an electronic system including one or more electronic modules, in accordance with an embodiment of the present invention.

FIG. 9 is a block diagram of an electronic system 800, which includes an electronic module 802 comprising a connection system 804, in accordance with an embodiment of the present invention. The electronic system 800 includes a processor 806 for performing various computing functions, such as executing specific software to perform specific calculations or tasks. Additionally, the electronic system 800 includes one or more input devices 808, such as a keyboard or a mouse, coupled to the processor 806 to allow an operator to interface with the electronic system 800. Typically, the electronic system 800 also includes one or more output devices 810 coupled to the processor 806, such output devices typically being a printer, a video terminal or a network connection. One or more data storage devices 812 are also typically coupled to the processor 806 to store data or retrieve data from external storage media (not shown). Examples of typical data storage devices 812 include hard and floppy disks, tape cassettes, and compact disks. It will be understood, however, that the connection system of the various embodiments of the present invention may also be incorporated into any one of the input, output, storage, and processor devices 808, 810, 812 and 806.

Although the present invention has been shown and described with reference to particular preferred embodiments, various additions, deletions and modifications that are obvious to a person skilled in the art to which the invention pertains, even if not shown or specifically described herein, are deemed to lie within the scope of the invention as encompassed by the following claims.

What is claimed is:

1. An edge connector, comprising:
   a substrate including a plurality of conductive layers electrically insulated from each other and further, including a first major exterior surface, a second major exterior surface, and a minor exterior surface substantially orthogonal to at least one of the first and second major exterior surfaces;
   at least one of an at least one first conductive contact affixed to the first major exterior surface and conductively coupled adjacent to one of the plurality of conductive layers and an at least one second conductive contact affixed to the second major exterior surface and conductively coupled adjacent to another one of the plurality of conductive layers; and
   at least one third conductive contact conductively coupled at least partially adjacent to at least a portion of a first internal conductive layer of the substrate, the at least one third conductive contact configured off-plane from the minor exterior surface, wherein at least a portion of the substrate extends outward from the minor exterior surface and the at least one third conductive contact is affixed thereon.

2. The edge connector, as recited in claim 1, wherein the at least one third conductive contact forms a continuous contact by extending along the portion extending outward from the minor exterior surface.

3. The edge connector, as recited in claim 1, wherein the substrate includes at least a first and a second internal conductive layers and wherein the at least a portion of the substrate includes the at least the first internal conductive layer and at least another portion of the substrate includes the at least the second conductive layer and extends inward from the minor exterior surface and the at least one third conductive contact is affixed to the first internal conductive layer of the portion, the edge connector further comprising at least one fourth conductive contact affixed to the second internal conductive layer of the portion.

4. The edge connector, as recited in claim 3, wherein at least one of the at least one third conductive contact and the at least one fourth conductive contact forms a continuous contact by extending along the portion extending inward from the minor exterior surface.

5. The edge connector, as recited in claim 1, wherein the substrate includes at least a first and a second internal conductive layers and wherein the at least a portion of the substrate includes the first and the second internal conductive layers and extends outward from the minor exterior surface and the at least on third conductive contact is affixed to the first internal conductive layer of the portion, the edge connector further comprising at least one fourth conductive contact affixed to the second internal conductive layer of the portion.

6. The edge connector, as recited in claim 5, wherein at least one of the at least one third conductive contact and the at least one fourth conductive contact forms a continuous contact extending along the portion extending outward from the minor exterior surface.

7. A printed circuit board, comprising:
   a substrate including a plurality of conductive layers electrically insulated from each other and further including a first major exterior surface, a second major exterior surface, and a minor exterior surface substantially orthogonal to at least one of the first and second major exterior surfaces;

a plurality of integrated circuit pads formed on the substrate for electrically interfacing with at least one integrated circuit; and an edge connector formed on one edge of the substrate, the edge connector including:

at least one of an at least one first conductive contact affixed to the first major exterior surface and conductively coupled adjacent to one of the plurality of conductive layers and an at least one second conductive contact affixed to the second major exterior surface and conductively coupled adjacent to another one of the plurality of conductive layers; and at least one third conductive contact conductively coupled at least partially adjacent to at least a portion of a first internal conductive layer of the substrate, the at least one third conductive contact configured off-plane from the minor exterior surface, wherein at least a portion of the substrate extends outward from the minor exterior surface and the at least one third conductive contact is affixed thereon.

8. The printed circuit board, as recited in claim 7, wherein the at least one third conductive contact forms a continuous contact by extending along the portion extending outward from the minor exterior surface.

9. The printed circuit board, as recited in claim 7, wherein the substrate includes at least a first and a second internal conductive layers and wherein the at least a portion of the substrate includes the at least the first internal conductive layer and at least another portion of the substrate includes the at least second conductive layer and extends inward from the minor exterior surface and the at least one third conductive contact is affixed to the first internal conductive layer of the portion, the edge connector further comprising at least one fourth conductive contact affixed to the second internal conductive layer of the portion.

10. The printed circuit board, as recited in claim 9, wherein at least one of the at least one third conductive contact and the at least one fourth conductive contact forms a continuous contact by extending along a portion extending inward from the minor exterior surface.

11. The printed circuit board, as recited in claim 7, wherein the substrate includes at least a first and a second internal conductive layers and wherein the at least a portion of the substrate includes the first and the second internal conductive layers and extends outward from the minor exterior surface and the at least on third conductive contact is affixed to the first internal conductive layer of the portion, the edge connector further comprising at least one fourth conductive contact affixed to the second internal conductive layer of the portion.

12. The printed circuit board, as recited in claim 11, wherein at least one of the at least one third conductive contact and the at least one fourth conductive contact forms a continuous contact extending along a portion extending outward from the minor exterior surface.

13. An electronic module, comprising:

a printed circuit board, including:

a substrate including a plurality of conductive layers electrically insulated from each other and further including a first major exterior surface, a second major exterior surface, and a minor exterior surface substantially orthogonal to at least one of the first and second major exterior surfaces;

a plurality of integrated circuit pads formed on the substrate for electrically interfacing with at least one integrated circuit; and an edge connector formed on one edge of the substrate, the edge connector including:

at least one of an at least one first conductive contact affixed to the first major exterior surface and conductively coupled adjacent to one of the plurality of conductive layers and an at least one second conductive contact affixed to the second major exterior surface and conductively coupled adjacent to another one of the plurality of conductive layers; and at least one third conductive contact conductively coupled at least partially adjacent to at least a portion of a first internal conductive layer electrically insulated from the first and second major exterior surfaces of the substrate, the at least one third conductive contact configured off-plane from the minor exterior surface, wherein at least a portion of the substrate extends outward from the minor exterior surface and the at least one third conductive contact is affixed thereon;

at least one integrated circuit attached to the substrate and electrically coupled to one of the at least one of the first, second and third conductive contacts.

14. The electronic module, as recited in claim 13, wherein the at least one third conductive contact forms a continuous contact by extending along the portion extending outward from the minor exterior surface.

15. The electronic module, as recited in claim 13, wherein the substrate includes at least a first and a second internal conductive layers and wherein the at least a portion of the substrate includes the at least the first internal conductive layer and at least another portion of the substrate includes the at least the second conductive layer and extends inward from the minor exterior surface and the at least one third conductive contact is affixed to the first internal conductive layer of the portion, the edge connector further comprising at least one fourth conductive contact affixed to the second internal conductive layer of the portion.

16. The electronic module, as recited in claim 15, wherein at least one of the at least one third conductive contact and the at least one fourth conductive contact forms a continuous contact by extending along the portion extending inward from the minor exterior surface.

17. The electronic module, as recited in claim 13, wherein the substrate includes at least a first and a second internal conductive layers and wherein the at least a portion of the substrate includes the first and the second internal conductive layers and extends outward from the minor exterior surface and the at least on third conductive contact is affixed to the first internal conductive layer of the portion, the edge connector further comprising at least one fourth conductive contact affixed to the second internal conductive layer of the portion.

18. The electronic module, as recited in claim 17, wherein at least one of the at least one third conductive contact and the at least one fourth conductive contact forms a continuous contact extending along the portion extending outward from the minor exterior surface.

19. The electronic module, as recited in claim 13, wherein the at least one integrated circuit is a memory device.

20. An electronic system, comprising:

a processor;

at least one of an input device, output device, storage device, and electronic module operationally coupled to the processor; and wherein at least one of the at least one input device, output device, storage device, and electronic module includes at least one edge connector formed on one end of a substrate including a plurality of conductive layers electrically insulated from each other and further including a first major exterior surface, a second major exterior surface and a minor exterior surface substantially orthogonal to at least one of the first and second major exterior surfaces, the edge connector including:

at least one of an at least one first conductive contact affixed to the first major exterior surface and conductively coupled adjacent to one of the plurality of the conductive layers and an at least one second conductive contact affixed to the second major exterior surface and conductively coupled adjacent to another one of the plurality of conductive layers; and at least one third conductive contact conductively coupled at least partially adjacent to at least a portion of a first internal conductive layer electrically insulated from the first and second major exterior surfaces of the substrate, the at least one third conductive contact configured off-plane from the minor exterior surface, wherein at least a portion of the substrate extends outward from the minor exterior surface and the at least one third conductive contact is affixed thereon.

21. The electronic system, as recited in claim 20, wherein the at least one third conductive contact forms a continuous contact by extending along the portion extending outward from the minor exterior surface.

22. The electronic system, as recited in claim 20, wherein the substrate includes at least a first and a second internal conductive layers and wherein the at least a portion of the substrate includes the at least the first internal conductive layer and at least another portion of the substrate includes the at least the second conductive layer and extends inward from the minor exterior surface and the at least one third conductive contact is affixed to the first internal conductive layer of the portion, the edge connector further comprising at least one fourth conductive contact affixed to the second internal conductive layer of the portion.

23. The electronic system, as recited in claim 22, wherein at least one of the at least one third conductive contact and the at least one fourth conductive contact forms a continuous contact by extending along the portion extending inward from the minor exterior surface.

24. The electronic system, as recited in claim 20, wherein the substrate includes at least a first and a second internal conductive layers and wherein the at least a portion of the substrate includes the first and the second internal conductive layers and extends outward from the minor exterior surface and the at least one third conductive contact is affixed to the first internal conductive layer of the portion, the edge connector further comprising at least one fourth conductive contact affixed to the second internal conductive layer of the portion.

25. The electronic system, as recited in claim 24, wherein at least one of the at least one third conductive contact and the at least one fourth conductive contact forms a continuous contact extending along the portion extending outward from the minor exterior surface.

* * * * *